United States Patent
Yi

(10) Patent No.: US 6,548,996 B2
(45) Date of Patent: Apr. 15, 2003

(54) OPTIMIZED ON/OFF CONTROL CIRCUIT

(75) Inventor: Xinchun Yi, Plano, TX (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/873,074

(22) Filed: Jun. 1, 2001

(65) Prior Publication Data

US 2002/0180412 A1 Dec. 5, 2002

(51) Int. Cl.[7] .............................................. G05B 24/02
(52) U.S. Cl. .................... 323/349; 323/904; 307/141.4; 315/360
(58) Field of Search .............................. 307/141, 141.4; 315/199, 360; 323/318, 349, 904, 288

(56) References Cited

U.S. PATENT DOCUMENTS 4,500,795 A * 2/1985 Hochstein et al. .......... 307/141
6,184,671 B1 * 2/2001 Han et al. .................. 323/323

* cited by examiner

Primary Examiner—Michael Sherry
Assistant Examiner—Gary L. Laxton
(74) Attorney, Agent, or Firm—Michael Schmitt

(57) ABSTRACT

An on/off control circuit is provided that controls the application of power to a device. The effectiveness of the on/off control circuit is optimized with regard to cost, power consumption, component life, and utility. An R-C circuit is used to provide a time-delayed turn-on, and turn-off, of the device being controlled, accompanied by a latch that retains the on/off state and controls the coupling of a power source to the device being controlled. The latch is configured as a data flip-flop (DFF) with a clocking signal that is controlled by the time-delayed switch input. The flip-flop has an inverted output signal as its input, thereby providing a toggled on/off operation. The latch also includes an independent reset input, thereby allowing an independent turn-off operation by power management controllers within the device being controlled. In the quiescent state, the preferred embodiment consumes less than half a microWatt of power.

22 Claims, 2 Drawing Sheets

OPTIMIZED ON/OFF CONTROL CIRCUIT

BACKGROUND OF THE INVENTION

1. Field of the Invention

This invention relates to the field of electronic circuits and devices, and in particular to a circuit and device that provides a low-power, low-cost, on/off control for power supplies within devices, with configurable delay characteristics.

2. Description of Related Art

Most switches that control the application of power within a device are mechanical contact switches that connect a battery or other power source to a power supply, such as a voltage regulated supply.

Complex electronic devices, such as computers, include electronic on/off control switches, wherein the mechanical switch that a user operates provides an input to an electronic circuit, and this electronic circuit provides the connection between the power source and the device's power supply. In this manner, other control schemes can be used to provide on/off control, by providing other inputs to the electronic circuit. These on/off control circuits also often provide a delayed turn-off, which require the depression of the mechanical on/off switch for an extended duration before power is disconnected from the device, to avoid inadvertent power shut-offs which could cause the loss of data. Providing a delayed turn-off is a fairly simple design task, because while the device is turned on, power is available for running timer circuits, activating shutdown procedures, and so on.

A common problem in portable, low-power, devices is the unintentional turn-on of the device, when the user inadvertently activates a mechanical switch, which can substantially shorten the useful battery life. The useful battery life can also be shortened by unintentionally leaving the device turned on after use. Another problem is the over-use, or over-frequent use, of the on/off switch, because the frequent application and removal of power causes undue stress on the components within the device, causing premature failure.

Timing circuits, similar to those used in conventional on/off control circuits, can be used to provide a delayed turn-on of the device, to prevent unintentional activations, but such circuits require active components that will consume power, particularly during each unintentional activation. Also, the cost of conventional on/off control switches often precludes their use in low-cost devices, or low-profit-margin devices, such as cellular telephones.

BRIEF SUMMARY OF THE INVENTION

It is an object of this invention to provide an on/off control circuit that reduces the likelihood of inadvertent turn-on of a device. It is a further object of this invention to provide an on/off control circuit that draws minimal current in the quiescent state. It is a further object of this invention to provide an on/off control circuit that is usable by other functional elements within the device being controlled. It is a further object of this invention to provide an on/off control circuit that minimizes the stress on components within the circuit, and within the device being controlled.

These objects, and others, are achieved using a variety of techniques designed to optimize the effectiveness of an on/off control circuit. The effectiveness of the on/off control circuit is optimized with regard to cost, power consumption, component life, and utility. An R-C circuit is used to provide a time-delayed turn-on, and turn-off, of the device being controlled, accompanied by a latch that retains the on/off state and controls the coupling of a power source to the device being controlled. The latch is configured as a data flip-flop (DFF) with a clocking signal that is controlled by the time-delayed switch input. The flip-flop has an inverted output signal as its input, thereby providing a toggled on/off operation. The latch also includes an independent reset input, thereby allowing an independent turn-off operation by power management controllers within the device being controlled. In the quiescent state, the preferred embodiment consumes less than half a microWatt of power.

BRIEF DESCRIPTION OF THE DRAWINGS

The invention is explained in further detail, and by way of example, with reference to the accompanying drawings wherein.

Throughout the drawings, the same reference numerals and symbols indicate similar or corresponding features or functions.

DETAILED DESCRIPTION OF THE INVENTION

Figure 1:
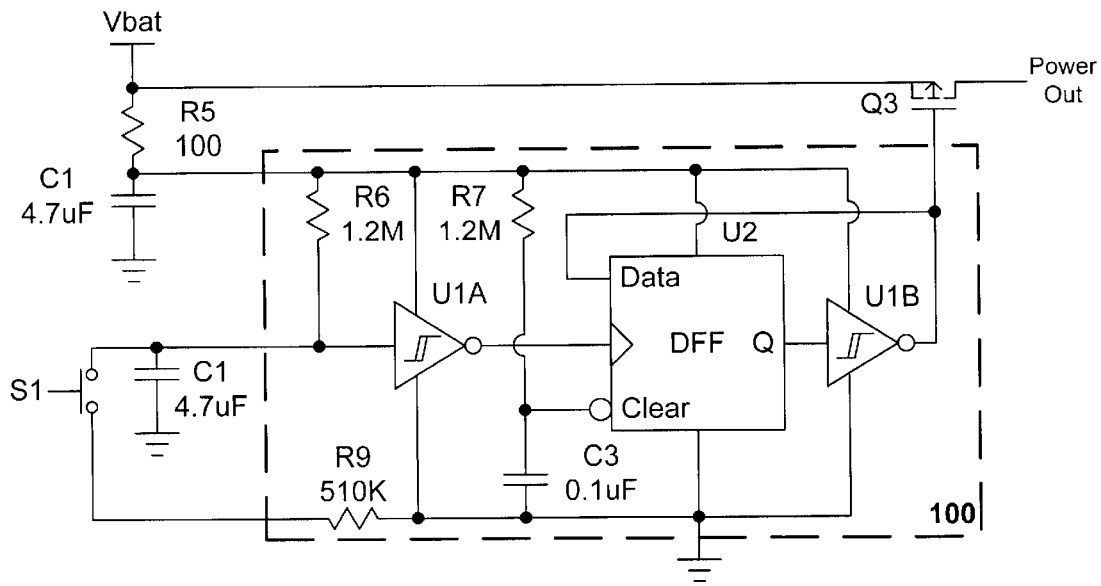
FIG. 1 illustrates an example block diagram of an on/off control circuit in accordance with this invention.

FIG. 1 illustrates an example block diagram of an on/off control circuit 100 in accordance with this invention. The circuit 100 is configured to control a switch Q3 that couples a power source Vbat to a device being controlled (not shown), via the illustrated Power Out node. In a preferred embodiment, an R-C filter R5-C1 filters transients on the power source Vbat from affecting the circuit 100, although the circuit 100 may be powered directly from Vbat.

The initial condition of the circuit 100 is as follows. The resistor-capacitor combination of R7-C3 causes the data flip-flop (DFF) U2 to initialize to a clear, or reset, state, wherein the Q output is asserted to a logic-low level. The logic-low Q output drives the inverter U1B to a logic high state, which turns off the switch Q3 by bringing it to a non-conductive state, thereby decoupling Vbat from the Power Out node.

A push-button switch S1 controls the turn-on, turn-off, operation of the circuit 100, as follows. In a quiescent state, when switch S1 is in the open state, the capacitor C1 is charged to a voltage level equal to Vbat, via resistors R5 and R6. This voltage on C1 drives the output of the inverter U1A to a logic low state.

The data input to the DFF U2 is the inversion of its output Q, via the inverter U1B. This data input will be clocked to the output Q on a low-to-high transition of the output of the inverter U1A, causing the output Q to change state (toggle) with each low-to-high transition.

When the switch S1 is closed, the capacitor C1 discharges through resistor R9 toward a voltage level of Vbat*(R9/(R9+R5+R6). The speed of discharge is determined by the RC time constant R9*C1. When the capacitor C1 discharges to the lower trigger level of the inverter U1A, the output of the inverter U1A is driven high, causing a low-to-high transition on the clock input of the DFF U2. As illustrated, the inverter U1A is preferably a Schmitt trigger device, to prevent multiple transients as the input voltage transitions through the lower trigger level, and to provide a "re-enabling" delay to prevent over-frequent transitions, as discussed further below. To effect the transition, the aforementioned voltage level Vbat*(R9/(R9+R5+R6) must be below the lower trigger level of the inverter U1A. The low-to-high transition on the clock input to the DFF U2 causes the output Q to rise to a logic-high level, which causes the inverter U1B to be driven low, causing the switch Q3 to conduct, thereby coupling Vbat to the Power Out node.

Note that if the switch S1 is released prior to the low-to-high transition on the clock input to the DFF U2, the capacitor C1 begins to recharge to the Vbat level, via the resistors R5-R6. Thus, inadvertent short-duration closures of switch S1 will not cause the circuit 100 to turn-on the controlled device, because the switch Q3 will remain in the non-conducting state. In accordance with this invention, the switch S1 must be closed for a duration that is proportional to the RC time constant R9*C1. The actual turn-on duration is determined by the trigger level of the device U1A, the ratio of R9/(R9+R5+R6), and the capacitance C1, as in known in the art. Using a conventional Schmitt trigger having a lower trigger level of ½ the supply voltage, a delay of up to five seconds is achievable by using a capacitance C1 of five microfarads, and a one megohm resistor R9. Note also that a re-closure of the switch S1 will continue the discharge of C1, from whatever recharged voltage level the capacitor C1 has reached. Thus, assuming that the time delay provided by (R5+R6)*C1 is relatively long, an intermittent release of switch S1 will not cause a 'restart' of the timing delay.

In one preferred embodiment, the components that are contained within the dashed box that is identified as circuit 100 are encapsulated in a 5-pin module that can be used in a variety of applications. By encapsulating the circuit 100 as shown, a designer of the device that is being controlled merely selects a value of the capacitor C1 to determine the on/off delay time, and provides a switch Q3 suitable for the expected current draw of the device being controlled.

When the switch S1 is released, the capacitor C1 again charges toward Vbat. When it transitions above the upper trigger level of the inverter U1A, the output of the inverter U1A is again driven low. Note that only after the output of the inverter U1A is driven low can a low-to-high transition occur at the clock input of the DFF U2. Thus, until the output of the inverter U1A is driven low, repeated closures of the switch S1 will have no effect on the state of the DFF U2, and therefore no effect on the current conduction state of the device Q3. When the inverter U1A is driven low, the DFF U2 is re-enabled to provide a toggle of the device Q3 when the switch S1 is again closed. In this manner, the circuit 100 prevents over-frequent on/off state changes, thereby reducing the stress on components within the device being controlled. The time to reach the upper trigger level of the inverter U1A, is determined by the trigger level of the device U1A, and the values of R5, R6, and C1, as well as the discharge voltage level Vbat*(R9/(R9+R5+R6), as is known in the art. Using a conventional Schmitt trigger device U1A, the re-enabling delay of the illustrated circuit configuration of FIG. 1 is about a second or two.

After the DFF U2 is re-enabled, a subsequent closure of the switch S1 again starts the discharge of the capacitor C1. When the voltage on the capacitor C1 reaches the lower trigger level of the inverter U1A, the DFF U2 will toggle to its opposite state, thereby turning off the switch Q3. In this manner, closures of the switch S1 for the aforementioned on/off delay period, after the aforementioned re-enabling period, will toggle the switch Q3 from conducting, to nonconducting, to conducting, and so on.

Note that the resistance R9 is in series with the switch S1, and is typically at least a hundred kilohms. This high series resistance allows the use of a switch S1 that has a relatively high contact resistance, thereby increasing the expected life, and reducing the expected cost, of the switch S1.

Figure 2:
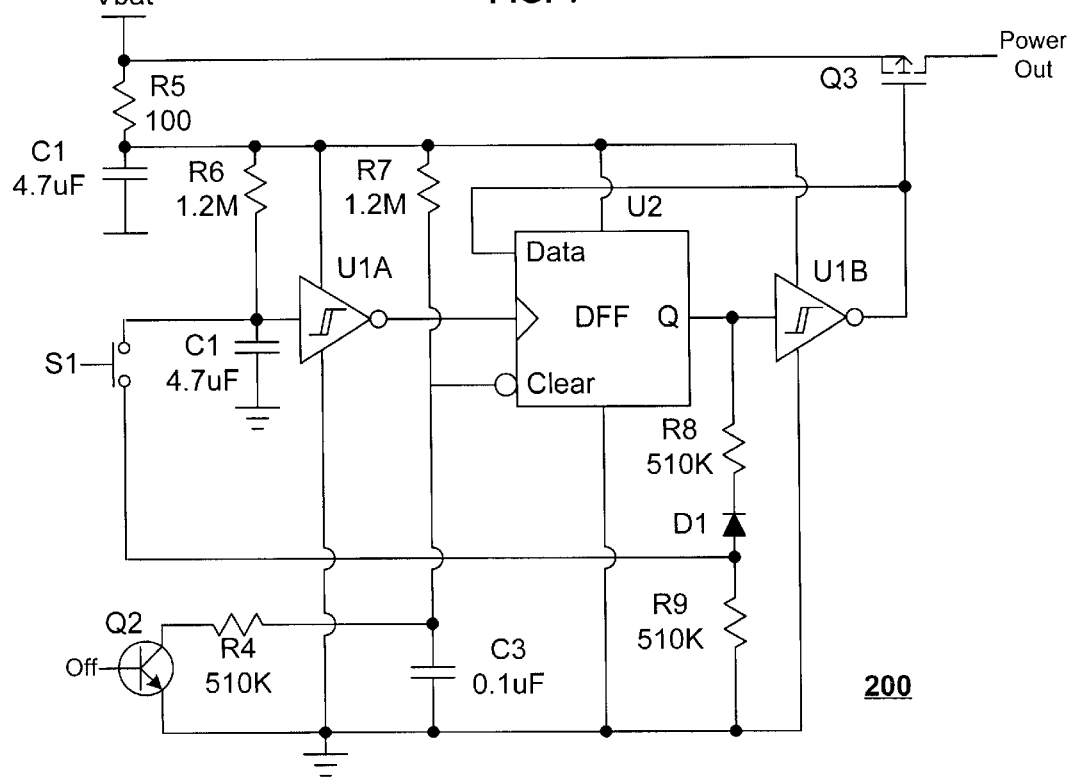
FIG. 2 illustrates an example block diagram of an on/off control circuit with independent turn-off control in accordance with this invention.
Figure 3:
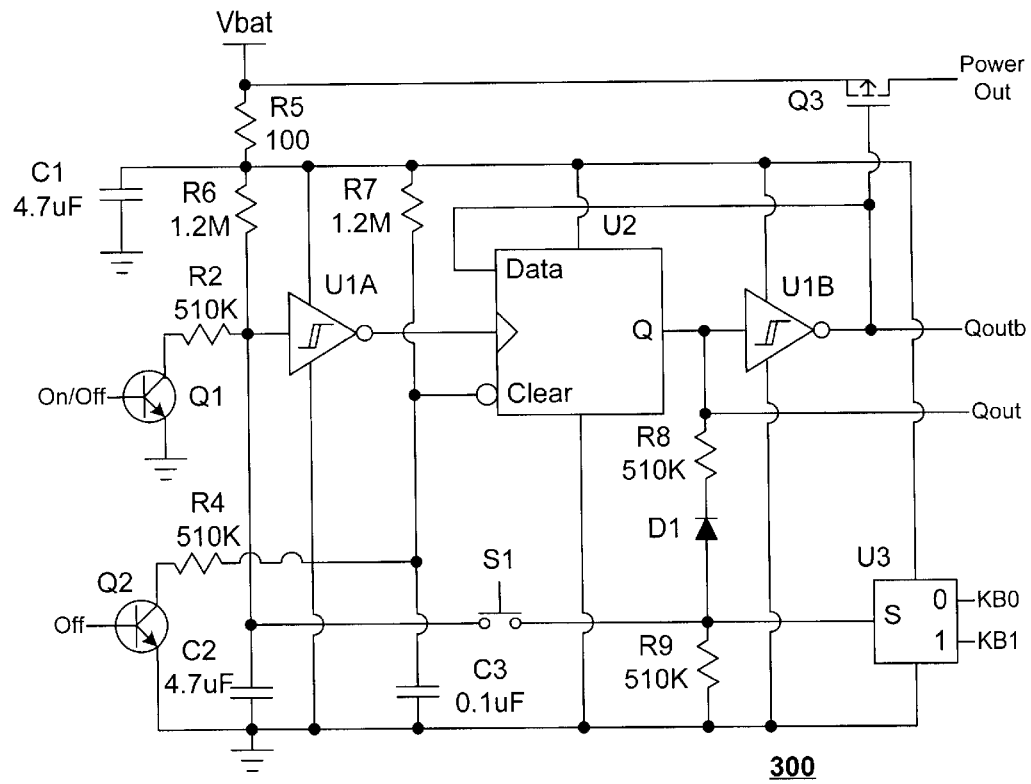
FIG. 3 illustrates an example block diagram of an on/off control circuit that includes interfaces for external switch controls in accordance with this invention.

FIGS. 2 and 3 illustrate example alternative embodiments, using the principles discussed above with regard to FIG. 1 for providing a controlled on/off delay and protection against over-frequent changes of state of the Power Out signal.

FIG. 2 illustrates an example block diagram of an on/off control circuit 200 with independent turn-off control and other features in accordance with this invention. A switch Q2 is provided for resetting the DFF U2 to a clear (output Q low) state, independent of the status of the clock or data inputs to the DFF U2. This clear state drives the output of the inverter U1B to a logic-high state, thereby placing the switch Q3 into a non-conducting state and decoupling the power source from the device being controlled. In a preferred embodiment, the switch Q2 is typically controlled by a power-management function within the device being controlled. In this manner, an automatic shut-off function can be provided to prevent battery discharge while the device is not being actively used. The switch Q2, or another switch in parallel to switch Q2 may also be provided as a 'reset' button for forcing the on/off control circuit 100 to a known power-off state. The values of R4 and C3 are not critical to this design. Capacitor C3 is provided to prevent unwanted resets of the DFF U2 by noise signals, and resistor R4 is provided to minimize the current draw when the device Q2 conducts, and to provide an R-C time delay, with capacitor C3, for this turn-off control. This R-C time delay facilitates, for example, coupling the input of the device Q2 to a voltage fault monitor, to disconnect the device if a low voltage is detected for a predefined duration corresponding to the R-C time delay.

Also illustrated in FIG. 2 is a diode-resistor combination D1-R8 that provides for providing different turn-on and turn-off delays for the switch S1. When the DFF U2 is in the off-state (switch Q3 non-conducting), the output Q is low. When switch S1 is closed while the DFF U2 is in the off-state, the diode D1 will be placed in the forward conduction state, because of the voltage on capacitor C1, and the resistor R8 will be placed in parallel to the discharge resistor R9. When the DFF U2 is in the on-state, the output Q is high, and a closure of the switch S1 will not place the diode D1 in the forward conduction state, and the resistor R8 will not be placed in parallel to the discharge resistor R9. Therefore, the turn-on delay will be dependent upon the parallel resistance of resistors R8 and R9, while the turn-off delay will be dependent upon the resistor R9, and not R8. In this manner, different turn-on and turn-off delays can be accommodated. Note that if a longer turn-on time than turn-off time is desired, the orientation of the diode D1 is reversed.

FIG. 3 illustrates an example block diagram of an on/off control circuit 300 that includes additional interfaces for external switch controls in accordance with this invention. A switch Q1 is provided in parallel to the switch S1 and resistor R9 discharge path, to allow for electronic control of the switch Q3, via the control circuit 300. The value of the resistor R2 will determine the on/off delay time via the switch Q1, in the same manner that the resistor R9 determines the delay times for switch S1, discussed above.

Also illustrated in FIG. 3 are available output signals Qout and its inverse Qoutb, as well as key status signal KB0, KB1. The outputs Qout and Qoutb provide the current on/off status of the circuit 100, and the key status signals KB0 and KB1 provide the current status of the switch S1, via a selector switch U3. Preferably, the select input S to the switch U3 is high impedance, so as not to affect the discharge time constant provided by resistor R9. These outputs are provided for use by the device being controlled, as illustrated in FIG. 4.

Figure 4:
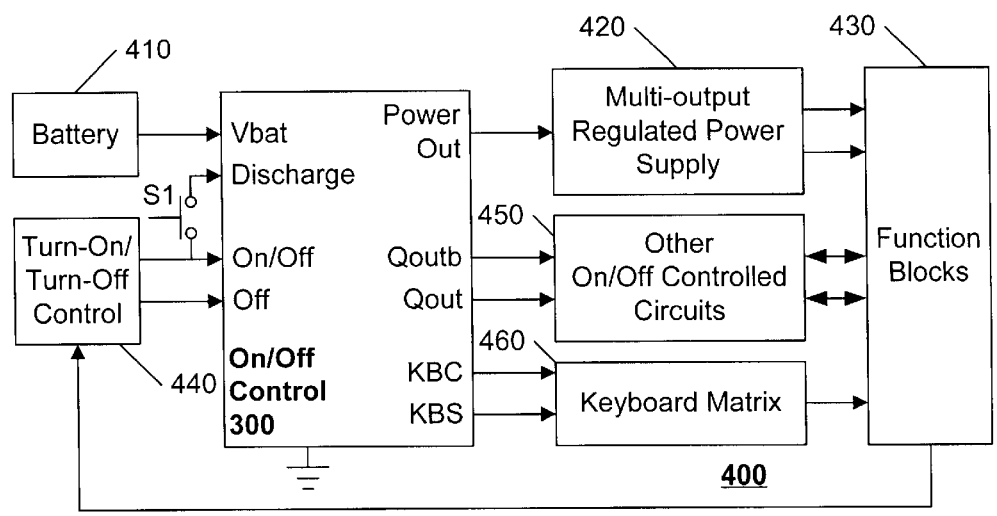
FIG. 4 illustrates an example block diagram of a controlled device with an on/off control circuit in accordance with this invention.

FIG. 4 illustrates an example block diagram of a controlled device 400 with an on/off control circuit 300 in accordance with this invention. The controlled device 400 may be, for example, a cellular telephone device that is configured for optimal on/off control performance.

The on/off control circuit 300 controls the coupling between a battery 410 and a multi-function regulated power supply 420 that distributes power to a variety of functional blocks 430 within the device. For example, in the cellular telephone example, separate regulated voltages are provided for: General Purpose Input/Output, Digital Signal Processing, Analog; and RF module functions. In a PDA device, separate controlled voltages may be provided to the processor, the display, and the memory, to efficiently manage the power utilization.

To minimize unnecessary power consumption, the device 400 includes a control block 440 that provide for automated turn-on or turn-off of the device, via the on/off and off control input signals to the on/off control circuit 300. The automated turn-on allows, for example, a periodic turn-on of the device, to periodically check for messages. To provide an automated turn-on, however, the device 440 will draw power from the battery 410 directly, as illustrated by the dashed line between the battery 410 and the device 440. Automated turn-off can be provided without this direct connection to the battery 410, because the on/off control device will be in the on state, and power will be provided to the device via the Power Out connection to the device's power supply 420. The independent off control of the on/off control 300 is typically connected to a watch-dog-timer function in the control block 440, to automatically disconnect the power from the device if the device enters a 'hung' or 'crashed' state. The watch-dog-timer is configured to be automatically reset periodically during the normal operation of the device, and times-out only if the normal operation is affected, and the automatic reset does not occur. Alternatively, the off-control may be connected to a not-easy-to-accidentally-access switch that can be activated manually to force a shutdown of the device.

Other functional blocks 450, 460 may be configured to operate in dependence upon the state of the on/off control 300, or the state of the switch S1. For example, a warning message may be provided when the switch S1 is depressed to turn the device off; or, an indicator light may be included to provide visual feedback when the switch S1 is activated, before the device is turned on. Additionally, the switch S1 can be configured to provide multiple functions, wherein via the keyboard matrix 460, a depression and release of the switch S1 in less than the turn-off duration is interpreted as a particular other signal, such as a momentary-break function that activates an illumination of a display, and so on.

The foregoing merely illustrates the principles of the invention. It will thus be appreciated that those skilled in the art will be able to devise various arrangements which, although not explicitly described or shown herein, embody the principles of the invention and are thus within its spirit and scope. For example, although the example circuit of FIGS. 1–3 are illustrated as DC control circuits, the use of a Triac device as the switch Q3 will permit the switching of an AC load, as well. Both bipolar and MOSFET technologies may be used for providing the power switch Q3. Other switching devices, such as solenoids and relays may also be used as the switch Q3, although such devices may not be suitable for low-cost, low-power applications. Also note that the voltage being switched by the switch Q3 need not be the same voltage source that provides the Vbat supply voltage to the circuit 100. Thus, for example, a small button battery can be provided as the source of Vbat, and a larger capacity voltage source can be the voltage that is coupled and decoupled to the device being controlled, via the switch Q3. Also, alternative configurations than those illustrated may be employed. For example, the switch S1 and resistor R9 (and likewise switch Q1 and resistor R2) may be configured to charge the capacitor C1, rather than discharge it. These and other system configuration and optimization features will be evident to one of ordinary skill in the art in view of this disclosure, and are included within the scope of the following claims.

I claim:

1. A control circuit comprising:
   an R-C delay circuit that is configured to provide a characteristic R-C response to an activation of a first switch,
   a trigger device, operably coupled to the R-C delay circuit, that is configured to receive the characteristic R-C response and to provide therefrom a delayed transition signal corresponding to the activation of the first switch, and
   a latch device, operably coupled to the trigger device, that is configured to receive the delayed transition signal and to provide therefrom a switch control signal,
   the switch control signal being configured to control a second switch that couples a power source to a controlled device.

2. The control circuit of claim 1, further including at least one of the first and second switches.

3. The control circuit of claim 1, wherein the latch device is further configured to receive a reset-control signal that controls the switch control signal independent of the first switch.

4. The control circuit of claim 3, further including an other R-C delay circuit that is configured to provide the reset-control signal after a predefined time delay of detecting an activation of a third switch.

5. The control circuit of claim 1, wherein the characteristic R-C response is dependent upon a state of the latch device.

6. The control circuit of claim 1, wherein the R-C delay circuit and the trigger device are further configured to prevent a generation of the delayed transition signal when the first switch is activated within a defined period since a prior activation of the first switch.

7. The control circuit of claim 1, wherein the first switch is at least one of a mechanical switch and a controlled transistor.

8. The control circuit of claim 1, wherein the R-C delay circuit includes a series circuit that includes the first switch and a resistor, and a capacitor that is operably coupled in parallel to the series circuit, such that an activation of the first switch causes a change in a charge potential at the capacitor, via a current flow through the resistor; and the trigger device provides the delayed transition signal in dependence upon the charge potential.

9. The control circuit of claim 1, wherein
the second switch includes at least one of: a MOSFET device, a Triac device, a bipolar device, a relay, and a solenoid.

10. The control circuit of claim 1, wherein
less than half a microwatt is consumed by the control circuit when the control circuit is in a quiescent state.

11. A system comprising:
one or more functional blocks, and
an on/off control circuit that is configured to selectively couple a power source to the one or more functional blocks;
the on/off control circuit including:
an R-C delay circuit that is configured to provide a characteristic R-C response to an activation of a first switch,
a trigger device, operably coupled to the R-C delay circuit, that is configured to receive the characteristic R-C response and to provide therefrom a delayed transition signal corresponding to the activation of the first switch,
a latch device, operably coupled to the trigger device, that is configured to receive the delayed transition signal and to provide therefrom a switch control signal, and
a second switch, operably coupled to the latch device, that selectively couples the power source to the one or more functional blocks, based on the switch control signal.

12. The system of claim 11, further including
a power supply, operably coupled between the on/off control circuit and the one or more functional blocks that is configured to receive power from the on/off control circuit, via the second switch, and to provide therefrom regulated power to the one or more functional blocks.

13. The system of claim 11, wherein
the latch device is further configured to receive a reset-control signal from the one or more functional blocks that controls the switch control signal independent of the first switch.

14. The system of claim 13, further including
an other R-C delay circuit that is configured to provide the reset-control signal after a predefined delay from a time of an activation of a third switch.

15. The system of claim 14, wherein
the activation of the third switch corresponds to a detection of a voltage fault, thereby facilitating a de-coupling of the one or more functional blocks in the presence of the voltage fault.

16. The system of claim 11, wherein
the characteristic R-C response is dependent upon a state of the latch device.

17. The system of claim 11, wherein
the R-C delay circuit and the trigger device are further configured to prevent a generation of the delayed transition signal when the first switch is activated within a defined period since a prior activation of the switch.

18. The system of claim 11, wherein
the R-C delay circuit includes
a series circuit that includes the first switch and a resistor, and
a capacitor that is operably coupled in parallel to the series circuit,
such that an activation of the first switch causes a change in a charge potential at the capacitor, via a current flow through the resistor; and the trigger device provides the delayed transition signal in dependence upon the charge potential.

19. An on/off control circuit comprising:
a trigger device that is configured to receive a switch input signal and to provide therefrom a delayed transition signal corresponding to an transition of the switch input signal through a trigger voltage level, and
a latch device, operably coupled to the trigger device, that is configured to maintain a logic state in the absence of the delayed transition signal, and to toggle to an opposite state upon receipt of the delayed transition signal; wherein
the logic state of the latch device is configured to control a power switch that is configured to couple a power source to a controlled device, and
the transition of the switch input signal is determined by an R-C time delay.

20. The on/off control circuit of claim 19, wherein
the switch input signal corresponds to a charge potential on a capacitor, and
the on/off control circuit further includes
a first resistor that is configured to provide a path for a change of the charge potential upon activation of a switch, and
a second resistor that is configured to provide an alternative path for an opposite change of the charge potential upon deactivation of the switch; wherein
the R-C time delay is dependent upon a capacitance value of the capacitor and a resistance value of the first resistor.

21. The on/off control circuit of claim 20, further including
a diode, operably coupled to the first resistor and to an output of the latch device corresponding to the logic state of the latch device, that is configured to provide a parallel path for the change of the charge potential upon activation of the switch, dependent upon the logic state of the latch device.

22. The on/off control circuit of claim 19, wherein
the latch device is configured to receive a reset signal that forces the logic state of the latch device to a known state, independent of the delayed transition signal.

* * * * *